United States Patent
Nishimura

(10) Patent No.: US 7,471,040 B2
(45) Date of Patent: Dec. 30, 2008

(54) MIXED-COLOR LIGHT EMITTING DIODE APPARATUS, AND METHOD FOR MAKING SAME

(75) Inventor: Ken A. Nishimura, Fremont, CA (US)

(73) Assignee: Avago Technologies ECBU IP (Singapore) Pte. Ltd., Singapore (SG)

(*) Notice: Subject to any disclaimer, the term of this patent is extended or adjusted under 35 U.S.C. 154(b) by 449 days.

(21) Appl. No.: 10/918,149

(22) Filed: Aug. 13, 2004

(65) Prior Publication Data

US 2006/0033423 A1 Feb. 16, 2006

(51) Int. Cl.
*H01J 1/62* (2006.01)
(52) U.S. Cl. .................. 313/501; 313/500; 313/506
(58) Field of Classification Search .......... 313/498–512
See application file for complete search history.

(56) References Cited

U.S. PATENT DOCUMENTS

| | | | | |
|---|---|---|---|---|
| 5,813,753 A | * | 9/1998 | Vriens et al. ................ 362/293 |
| 5,836,676 A | * | 11/1998 | Ando et al. .................. 362/244 |
| 6,091,195 A | * | 7/2000 | Forrest et al. ............... 313/504 |
| 6,155,699 A | | 12/2000 | Miller et al. |
| 6,246,179 B1 | * | 6/2001 | Yamada ...................... 313/506 |
| 6,475,819 B2 | * | 11/2002 | Franz .......................... 438/34 |
| 6,635,363 B1 | * | 10/2003 | Duclos et al. ............... 428/690 |
| 6,870,311 B2 | * | 3/2005 | Mueller et al. .............. 313/491 |
| 6,873,093 B2 | * | 3/2005 | Yu et al. ...................... 313/112 |
| 7,052,152 B2 | * | 5/2006 | Harbers et al. ................ 362/30 |
| 7,075,225 B2 | * | 7/2006 | Baroky et al. ............... 313/503 |
| 7,196,469 B2 | * | 3/2007 | Shore et al. ................. 313/506 |

\* cited by examiner

*Primary Examiner*—Nimeshkumar D Patel
*Assistant Examiner*—Anne M Hines

(57) ABSTRACT

A mixed-color light emitting diode (LED) apparatus may be made by forming a pixellated array of LEDs on a substrate, and then placing phosphors over at least some of the LEDs. The phosphors are chosen to convert light emitted by the LEDs to one or more different colors. The LEDs may be lithographically printed on the substrate, and the phosphors may be lithographically printed on the LEDs.

9 Claims, 3 Drawing Sheets

MIXED-COLOR LIGHT EMITTING DIODE APPARATUS, AND METHOD FOR MAKING SAME

BACKGROUND

Direct view, mixed-color (e.g., red, green and blue (RGB)) displays are often formed using a combination of thin-film transistor (TFT) and liquid crystal technologies. Another alternative is to form a display using light emitting diodes (LEDs). That is, a plurality of LEDs of different colors (e.g., RGB) may be arranged on a substrate in pixellated fashion. However, the formation of displays using different colored LEDs has been hampered by high manufacturing costs, as it is difficult to properly place and attach millions of differently colored LEDs (e.g., RGB) to a common substrate.

SUMMARY OF THE INVENTION

In one embodiment, a mixed-color light LED apparatus comprises a substrate, a pixellated array of LEDs formed on the substrate, and a plurality of phosphors placed over at least some of the LEDs. The phosphors convert light emitted by the LEDs to one or more different colors.

In another embodiment, a method for making a mixed-color LED apparatus comprises 1) forming a pixellated array of LEDs on a substrate, and placing phosphors over at least some of the LEDs (with the phosphors being chosen to convert light emitted by the LEDs to one or more different colors).

Other embodiments are also disclosed.

BRIEF DESCRIPTION OF THE DRAWINGS

Illustrative and presently preferred embodiments of the invention are illustrated in the drawings, in which.

DETAILED DESCRIPTION OF THE INVENTION

One reason for the lower manufacturing cost of a TFT/LCD display (versus an LED display) is that the electrical and colorizing components of a TFT/LCD display are separately manufactured, and then mated together. That is, the TFTs of a TFT/LCD display are formed on a first substrate (typically silicon), and the color filters of a TFT/LCD display are formed on a second substrate (typically glass). The two substrates are then aligned and mated with other display components in a sandwich-like assembly process. Often, the display's TFTs are formed on a substrate using a lithographic printing process.

In contrast to a TFT/LCD display, the electrical and colorizing components of an LED display are integrated. That is, the material used to manufacture an LED (an electrical element) determines the color of light that will be emitted from the LED. Hence, the color of light that is emitted from an LED is fixed. This also fixes the color of light that is emitted from a given position in an LED display. Thus, in an RGB LED display, a pixellated array of red, green and blue LEDs, each of which is formed using a different type of material, needs to be formed on a common substrate. This co-manufacture of different types of devices on a common substrate has made the manufacture of LED displays difficult.

Figure 1:
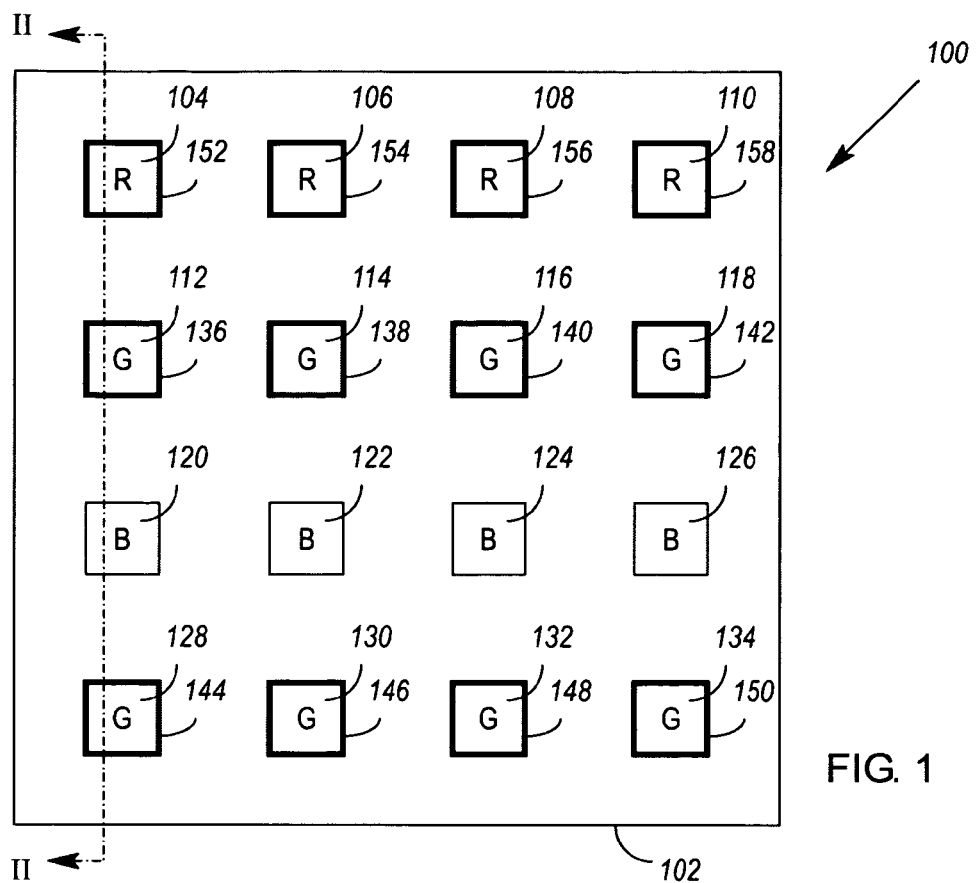
FIG. 1 provides a plan view of an exemplary mixed-color LED apparatus.
Figure 2:
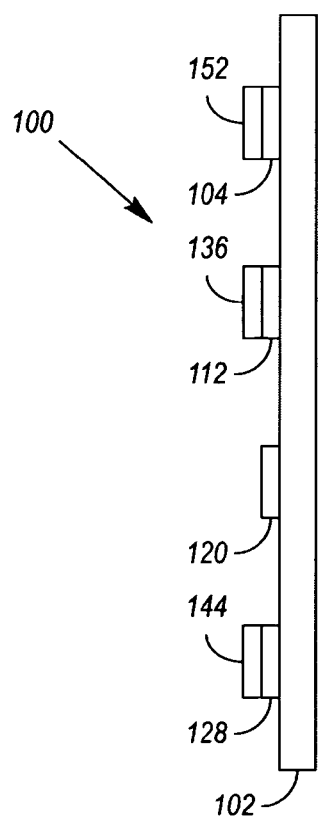
FIG. 2 provides a cross-sectional view of the LED apparatus shown in FIG. 1.
Figure 3:
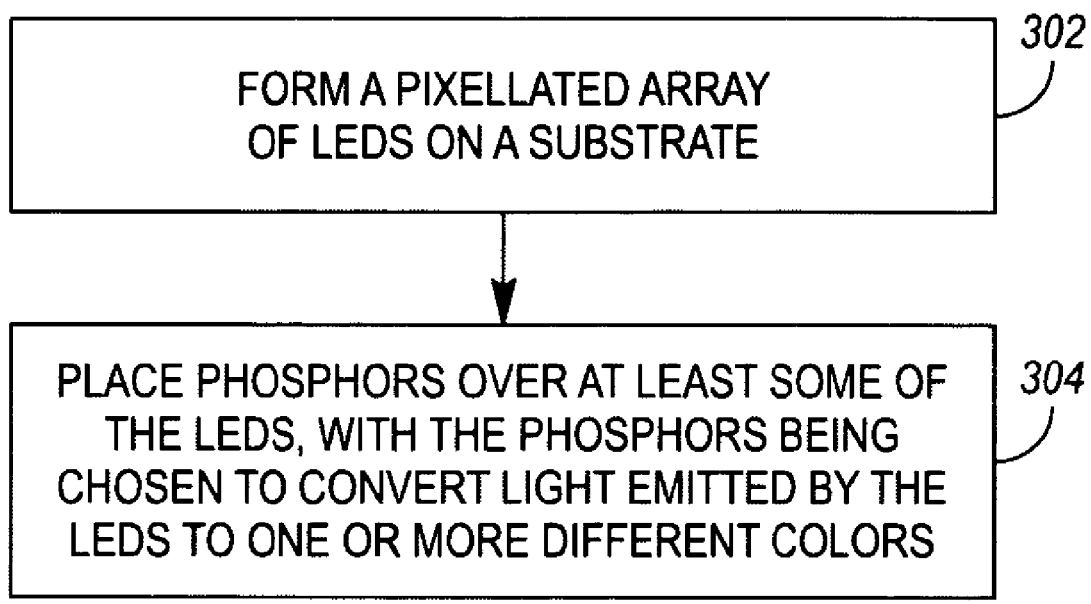
FIG. 3 illustrates a method for making a mixed-color LED apparatus such as that which is shown in FIGS. 1 & 2.

FIGS. 1 & 2 illustrate a mixed-color LED apparatus 100, wherein a pixellated array of LEDs 104-134 are formed 302 (FIG. 3) on a substrate 102 (e.g., a wafer or die of material such as silicon). A plurality of phosphors 136-158 are then placed 304 over at least some of the LEDs 104-118, 128-134, such that the phosphors 136-158 convert light emitted by the LEDs 104-18, 128-134 to one or more different colors.

By way of example, the LEDs 104-134 of the apparatus 100 may be nominally identical in material composition and color of light emission and, by way of example, may be blue or near-ultraviolet LEDs. As known in the art, these types of LEDs may be formed using an Indium-Gallium-Nitride (InGaN) alloy.

Figure 4:
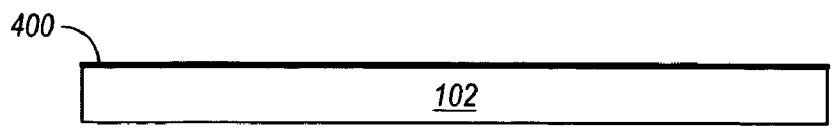
FIGS. 4-10 illustrate the making of a mixed-color LED apparatus using an exemplary embodiment of the FIG. 3 method.
Figure 5:
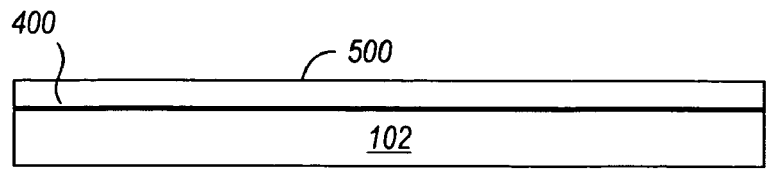
Figure 6:
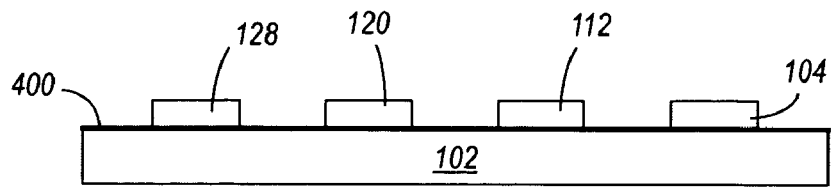
Figure 7:
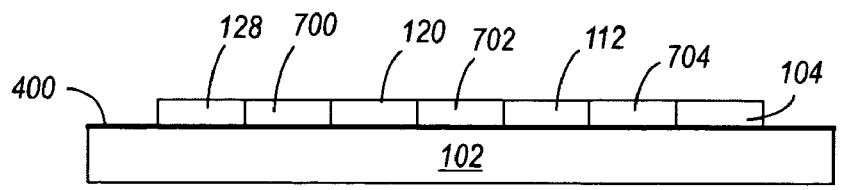
Figure 8:
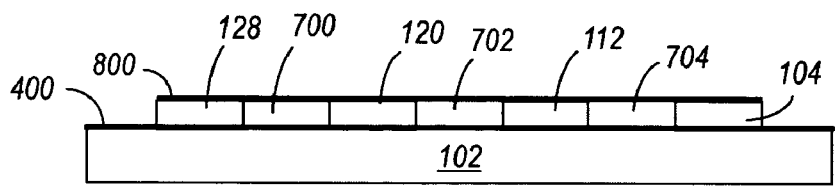
Figure 9:
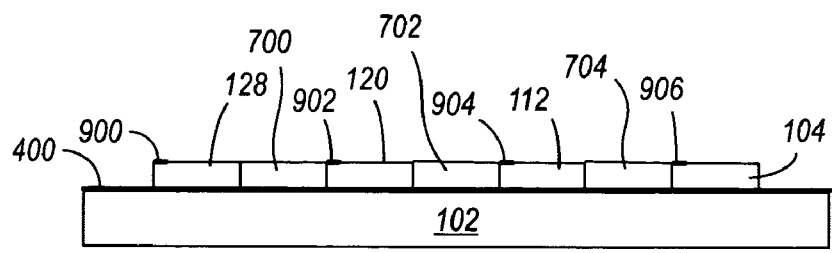

The pixellated array of LEDs 104-134 may be formed by depositing an LED layer structure on the substrate 102. In one embodiment, the LED layer structure comprises a number of active semiconductor layers sandwiched between upper and lower metallization layers. By way of example, the LED layer structure may be formed by first depositing a metal layer 400 (e.g., a thickfilm; see FIG. 4) on the substrate 102. This layer 400 may then be photolithographically patterned and etched to form individual and/or interconnected electrical contacts; or, as shown, this layer could be used as a node or terminal that is common to all LEDs 104-134. The requisite layer(s) 500 needed to form blue or near-ultraviolet LEDs 104-134 are then deposited (see FIG. 5). In one embodiment, these layer(s) 500 are grown using vapor deposition. These layer(s) 500 may then be photolithographically patterned and etched to form an array of active LED areas 104, 112, 120, 128 (see FIG. 6). At this stage of manufacture, each of the active LED areas 104, 112, 120, 128 is surrounded by a perimeter "void". These voids may optionally be filled with oxide 700, 702, 704 (FIG. 7) to present a planar surface over which a second metal layer 800 (FIG. 8) may be deposited. This second metal layer 800 may then be photolithographically patterned and etched to form contacts 900, 902, 904, 906 for individual ones and/or groups of the active LED areas 104, 112, 120, 128 (see FIG. 9).

Depending on the number and types of layers in the LED layer structure, its layers may be patterned and etched individually, or at the same time.

Patterning and etching LEDs in accordance with the method is not only more cost-effective than placing and attaching individual LEDs on a substrate, it also provides for better alignment of the LEDs.

Figure 10:
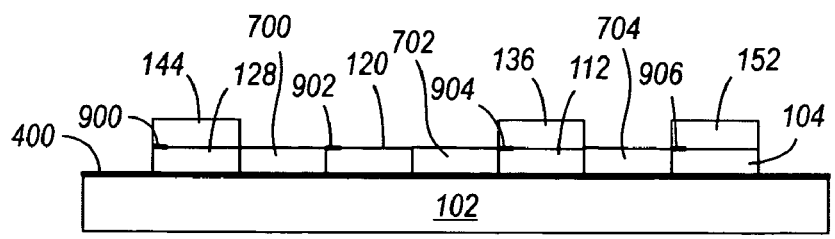

Phosphors 136-158 that are capable of converting blue or near-ultraviolet light to different colors of light (e.g., red, green and possibly blue light) may then be placed over some or all of the LEDs 104-118, 128-134 by, for example, lithographically printing them on the LEDs (see FIG. 10). In this manner, an RGB display (FIGS. 1, 2 & 10) may be formed using an array of only blue or near-ultraviolet LEDs 104-134.

In one embodiment, phosphors 136-150 that convert blue light to green light are printed on about fifty percent (50%) of the display's LEDs 112-118, 128-134; and phosphors 152-158 that convert blue light to red light are printed on about twenty-five percent (25%) of the display's LEDs 104-110. In another embodiment, phosphors that convert near-ultraviolet light to red light are printed on about twenty-five percent (25%) of the display's LEDs; phosphors that convert near-ultraviolet light to green light are printed on about fifty percent (50%) of the display's LEDs; and phosphors that convert near-ultraviolet light to red light are printed on about twenty-five percent (25%) of the display's LEDs. In these embodiments, each pixel in the display would comprise four LEDs (e.g., 104, 112, 120, 128), the colors of which would be mixed (e.g., by regulating the drive currents of the LEDs) to produce the color of a single image pixel.

Although examples have been provided wherein only blue or near-ultraviolet LEDs are formed on a substrate, other colors of LEDs (e.g., red or green) could also be formed on a substrate. Further, more than one type of phosphor could be placed over some or all of the LEDs. For example, a mix of phosphors that emit light in red, green and blue wavelengths could be placed over an LED to generate a white light.

It is also envisioned that apparatus formed in accordance with some or all of the above teachings need not be a full-color display. That is, any form of mixed-color LED apparatus (i.e., a display wherein two or more colors of light are mixed to produce the color of an image pixel) may be formed using the above teachings. One could also form a merely utilitarian or decorative device using the above teachings. Exemplary utilitarian devices include lamps and other light sources, or display backlights. An exemplary decorative device would be mood lighting.

What is claimed is:

1. A mixed-color light emitting diode (LED) apparatus, comprising: a substrate;
    a pixellated away of LEDs formed on the substrate wherein each of the LEDs is one of a) an inorganic semiconductor blue LED comprising a plurality of inorganic semiconductor layers or b) an inorganic semiconductor near-ultraviolet LED comprising a plurality of inorganic semiconductor layers; and
    a lithographic layer covering at least one portion of the pixellated array, the lithographic layer comprising at least one phosphor selected for converting light emitted by each of the LEDs in the at least one portion of the pixellated array into light of a second wavelength, wherein
    when the LEDs are blue LEDs, the lithographic layer is selected to convert light emitted by about twenty-five percent of the blue LEDs to red light and light emitted by about fifty percent of the blue LEDs to green light, and further wherein
    when the LEDs are near-ultraviolet LEDs, the lithographic layer is selected to convert light emitted by about twenty-five percent of the near-ultraviolet LEDs to red light, light emitted by about fifty percent of the near-ultraviolet LEDs to green light, and light emitted by about twenty-five percent of the near-ultraviolet LEDs to blue light.

2. The apparatus of claim 1, wherein the semiconductor LEDs of the pixelated array are nominally identical to each other in material composition and color of light emission.

3. The apparatus of claim 1, wherein the each of the semiconductor LEDs of the pixelated away includes a metal layer located between the plurality of inorganic semiconductor layers and the substrate, the metal layer configured as an electrical contact of the LED.

4. The apparatus of claim 3, wherein the at least one phosphor is selected for converting light emitted by at least some of the LEDs to white light.

5. The apparatus of claim 1, wherein the LEDs are formed from InGaN alloy.

6. A method for making a mixed-color light emitting diode (LED) apparatus, comprising:
    depositing a metal layer upon a substrate;
    depositing a plurality of inorganic semiconductor layers upon the metal layer;
    forming a pixellated array of LEDs comprising one of a) blue LEDs or b) near-ultraviolet LEDs by etching an array of active LED areas in the plurality of inorganic semiconductor layers, with each active LED area surrounded by a perimeter void; and
    using lithographic printing for depositing a phosphor layer over a first set of LEDs in the array of LEDs, said phosphor layer selected for converting light emitted by each of the first set of LEDs to a different wavelength, wherein
    when the LEDs are blue LEDs, the phosphor layer comprises a first phosphor selected to convert blue light to green light on about fifty percent of the blue LEDs, and a second phosphor selected to convert blue light to red light on about twenty-five percent of the blue LEDs, and wherein
    when the LEDs are near-ultraviolet LEDs, the phosphor layer comprises a third phosphor selected to convert near-ultraviolet light to red light on about twenty-five percent of the near-ultraviolet LEDs, a fourth phosphor selected to convert near-ultraviolet light to green light on about fifty percent of the near-ultraviolet LEDs, and a fifth phosphor selected to convert near-ultraviolet light to blue light on about twenty-five percent of the near-ultraviolet LEDs.

7. The method of claim 6, wherein the etching is carried out photolithographically.

8. The method of claim 6, further comprising:
    etching the metal layer to form a plurality of electrical contacts for the pixelated array of LEDs.

9. The method of claim 6, further comprising:
    filling each of the perimeter voids with an oxide.

* * * * *

UNITED STATES PATENT AND TRADEMARK OFFICE
CERTIFICATE OF CORRECTION

PATENT NO.      : 7,471,040 B2
APPLICATION NO. : 10/918149
DATED           : December 30, 2008
INVENTOR(S)     : Ken A. Nishimura It is certified that error appears in the above-identified patent and that said Letters Patent is hereby corrected as shown below:

Column 3, Line 28, Claim 1, delete "away" and insert -- array --;

Column 4, Line 5, Claim 3, delete "away" and insert -- array --.

Signed and Sealed this

Ninth Day of November, 2010

David J. Kappos
*Director of the United States Patent and Trademark Office*